(12) United States Patent
Busch et al.

(10) Patent No.: US 7,995,351 B2
(45) Date of Patent: Aug. 9, 2011

(54) PRINTED BOARD

(75) Inventors: Georg Busch, Ahaus (DE); Volker Detering, Emmerich (DE); Ludger Hinken, Lindau (DE); Ralf Lorenz, Borken-Gemen (DE)

(73) Assignee: Gigaset Communications GmbH, Munich (DE)

( * ) Notice: Subject to any disclaimer, the term of this patent is extended or adjusted under 35 U.S.C. 154(b) by 801 days.

(21) Appl. No.: 11/992,729

(22) PCT Filed: Jul. 5, 2006

(86) PCT No.: PCT/EP2006/063909
§ 371 (c)(1),
(2), (4) Date: Mar. 28, 2008

(87) PCT Pub. No.: WO2007/039331
PCT Pub. Date: Apr. 12, 2007

(65) Prior Publication Data
US 2009/0052146 A1 Feb. 26, 2009

(30) Foreign Application Priority Data
Sep. 30, 2005 (DE) .................. 10 2005 047 025

(51) Int. Cl.
*H05K 7/02* (2006.01)
*H05K 7/06* (2006.01)
*H05K 7/08* (2006.01)
*H05K 7/10* (2006.01)

(52) U.S. Cl. ......... 361/760; 361/704; 361/705; 361/763

(58) Field of Classification Search .......... 361/760–764, 361/704–710
See application file for complete search history.

(56) References Cited

U.S. PATENT DOCUMENTS

| 5,819,858 A * | 10/1998 | Nechansky .................... 174/252 |
| 6,636,062 B2 * | 10/2003 | Gaasch et al. ........... 324/750.09 |
| 7,251,138 B2 * | 7/2007 | Hornung et al. .............. 361/704 |

FOREIGN PATENT DOCUMENTS

| DE | 100 64 221 | 7/2002 |
| FR | 2 777 734 | 10/1999 |
| WO | WO 03/096414 | 11/2003 |

* cited by examiner

*Primary Examiner* — Tuan T Dinh
(74) *Attorney, Agent, or Firm* — Staas & Halsey LLP

(57) ABSTRACT

The invention relates to a printed board which comprises an inlay and on whose one face electrical components are provided and on whose other face at least one single cooling element for cooling the components is mounted. A component to be cooled, the inlay and the cooling element are aligned with each other. The components are SMD components of, e.g., a high-power output stage circuit with heat emissions of up to 10 to 15 watt. In order to cool the structure, the heat produced in a heating zone between the pins of a component to be cooled is guided to the inlay which is dimensioned in such a manner that it extends farther than below the pins of the component to be cooled. In order to prevent short-circuits and allow power connections, an additional layer is arranged on the printed board above the inlay and simultaneously below the component to be cooled and comprises thermic provisions between a component to be cooled and the inlay for ensuring a good to excellent heat conduction from the heating zone of a component to be cooled to the inlay.

9 Claims, 1 Drawing Sheet

PRINTED BOARD

CROSS REFERENCE TO RELATED APPLICATIONS

This application is based on and hereby claims priority to German Application No. 10 2005 047 025.4 filed on Sep. 30, 2005, the contents of which are hereby incorporated by reference.

BACKGROUND

The invention relates to a printed board.

When a problem arises for applications within the internal or external area of removing heat from high-power output stage transistors, for example high-frequency high-power output stage transistors at ambient temperatures of more than 40° C., high-power output stage transistors are normally used which are mounted by hand directly on a cooling body. This achieves very good removal of heat from the component and thereby from the output stage realized with this component. The electrical connections between an associated useful circuit, for example a high-frequency circuit, which is supplied with energy by the output stage, and the high-power output stage transistors are made with the aid of special connecting lines. The lengths of the lines and the precise positions at the associated connection pins are decisive in such cases for the function of the useful circuit, especially when a high-frequency circuit is involved.

Without special methods of heat removal in the connection technology of the high-power output stage transistors or generally of a relevant high-power component, with the output stage power which is the current aim, the high-power output components would be destroyed within a short time even at an ambient temperature of 20° C. Alternately the power of the output stage would have to be greatly reduced.

For production reasons it useful for the useful circuit to be able to be implemented inclusive of the associated output stage in surface-mount device (SMD) technology. When the currently known SMD technologies are used however the waste heat generated cannot be removed or not sufficiently removed at room temperature. The thermal resistance of known solutions is far too high. In addition, the distances between the connecting pins of the SMD power components which heat up during operation, especially in a heating area between the connecting pins, considerably restrict the maximum size of a so-called inlay which is already being used today which has good to very good heat conductivity and is arranged within the plane of the printed board lying below the useful circuit or the output stage. Such an inlay is positioned within the circuit board below a power component with the thickness of the circuit board and conducts the heat generated by the power component from one side of the circuit board on which the SMD power component is arranged through the circuit to the other side on which a cooling body for dissipation of the heat generated by the SMD power component and conducted with the aid of the inlay through the circuit board is arranged.

The distances between the pins of the power components are too small, given the power required, to enable a sufficiently large inlay to be arranged below the component which is able to conduct away the heat generated at the required power in the power component arranged above it sufficiently fast through the circuit board onto the cooling body on the other side of the circuit board. An inlay extending beyond the distance between the pins of a power component would lead to the pins being in direct contact with the inlay, which would mean firstly that there would be no longer be any option for electrical connection of the pins to an associated circuit and secondly that short circuits via the inlay would occur.

A system in accordance with the prior art, as has been explained in more detail above, is for example known from document DE 100 64 221 A1. Known from this document are in particular a printed circuit board with cooled SMD components as well as methods for its production, which features an inlay to direct the heat generated by a component arranged above it through the circuit board onto a cooling body arranged on the other side of the printed circuit board. In this case, the inlay is of a size to fit exactly between the connecting pins of the component to be cooled.

Known from document 03/096414 A2 is a circuit board with a heat-conducting inlay extending within the plane of the circuit board with the thickness of the circuit board to direct through the printed circuit board heat of at least a single SMD component arranged on the one side of the circuit board above the inlay, which heats up during operation, with associated connecting pins and a heating area arranged between the pins, through to a cooling body arranged on the other side of the circuit board, with the extent of the inlay being greater than that of the heating area enclosed by the associated connecting pins of the at least one single SMD component arranged above the inlay.

Also known from document FR 2 777 734 A1 is a printed circuit board with a circuit board which features a cutout into which a nose-shaped section of a cooling plate arranged below the circuit board extends, with a transistor to be cooled being arranged on the circuit board above said cutout arranged below it.

Using as its starting point a printed circuit board of the type stated at the start, the object of the present invention is to improve such a printed circuit board in such a manner that it is suitable for use especially for SMD high-power output stage transistors of the highest power class, for example with heat outputs of up to 10 to 15 watts.

SUMMARY

In accordance with the invention this object is achieved by a circuit board which has the features discussed herein.

A printed circuit board embodied accordingly has a significantly larger inlay below the power components to be cooled when compared to previous printed circuit boards. This larger inlay is in a position to conduct away the heat at a significantly higher rate. In a typical example the inlay might be three times as large as the component to be cooled. The inlay is so large that it extends out at least to below, but preferably to further than below, the connecting pins of the component to be cooled. This means that in turn a correspondingly larger cooling body with correspondingly improved cooling power is able to be provided on the other side of the printed circuit board. Despite this no short circuits occur via the inlay and connecting lines for the line connections to the connecting pins of the power components can be provided.

Because of the size of the inlay the cooling body can even be attached directly to the inlay. There is sufficient space for including attachment means for this purpose, for example, screws. This means that not only does a correspondingly increased contact surface exist between the inlay and the heat sink, but also a correspondingly more intensive contact between these parts, since the attachment means press the cooling body firmly onto the inlay. The thermal transfer resistance is thus sharply reduced. In addition an enlarged cooling body contributes to a significantly greater cooling effect. Overall a powerful cooling process is supported by the inventive measures.

A temperature transition region still basically exists as it did before between the component to be cooled and the inlay, the region being determined in the extent of its surface in parallel to the printed circuit board by the distances between the connecting pins of the component to be cooled. However in the direction of the inlay this transition area has only a very narrow thickness, namely the thickness of an additional layer arranged above the circuit board with as its base layer an associated carrier layer consisting of a corresponding printed circuit board material. The transition then occurs on the significantly enlarged cross-section of the now significantly larger inlay. This increased cross-section extends through to the cooling body.

The heat to be conducted away thus no longer has to penetrate the entire thickness of the circuit board in the previously known reduced cross-section before encountering the cooling body. It only has to penetrate this reduced cross-section in the narrower thickness of the additional layer arranged above the printed circuit board along with the thinner carrier layer. This means that, although the total thickness between the heat-generating component and the cooling body to be penetrated by the heat to be conducted away increases, the overall conductance on the overall penetration path improves, because the largest proportion of the penetration path is subject to a significantly improved thermal conductivity.

In this case the additional layer serves on the one hand to isolate the component to be cooled in relation to the inlay, and on the other hand serves to make available the connecting lines for connecting the connecting pins of the component to be cooled.

The heat created by the power component to be cooled can overall be directed much more quickly and in a significantly greater amount to the cooling body, which is also increased in size. A heat buildup simply no longer arises within the printed circuit board, which has enabled significantly more powerful components, especially also SMD components, to be used.

It is especially advantageous in this case for the additional layer to be a microlayer. In this case the thickness of the additional layer is especially small, making it possible to exchange heat even more effectively between power component and inlay.

So that this exchange of heat is especially effective, below the heating zone of an SMD component arranged above the inlay, including where possible the entire heating zone of the relevant SMD component, thermal provisions are made within the additional layer, through which the heat is conducted well to very well to the inlay arranged underneath it from the heating zone of the SMD component to be cooled. This can include a solder connection on the heating zone of the component to be cooled.

Other advantages of the inventive measures are that, by using SMD components for the high-power output stage transistors, assembly by hand can be dispensed with. The electrical connections between the high-power output stage transistors and a remaining circuit are already able to be implemented on the printed circuit board. Furthermore SMD components are far better than the corresponding screwed versions. There is no specific high-frequency balancing of the connecting lines, as is necessary in given cases with manual installation. The volume occupied by the circuit is significantly reduced. The use of the heat removal technique proposed here can basically also be used for other forms of construction.

Advantageous additional embodiments of the invention also described herein. According to these the cooling body arranged on the other side of the printed circuit board in relation to the SMD component is pressed onto the inlay by technical means, for example, the screws already mentioned, so that a very low thermal transfer resistance is produced between the inlay and the cooling body.

The ability for the cooling body to be attached to the inlay is only provided by the inventive measures, since only through these measures has the inlay become large enough for there to be space available for attachment means. In addition the attachment of the cooling body to the inlay has the advantage that racking of the circuit board is avoided, which can occur if the attachment means strain the circuit board and are tightened unevenly.

If a corresponding additional layer is also provided on the other side of the circuit board between the inlay and the cooling body, this has advantages during production because the two additional layers on the one side and the other side of the printed circuit board can be produced in a symmetrical manner. The production of the printed circuit board in a symmetrical manner means that there is no danger of the printed circuit board being distorted because of stresses occurring on one side of the printed circuit board. Furthermore the second additional layer can be used to lay the lines so that complex circuit structures can be implemented. It is possible to provide the second additional layer between the inlay and the heat sink with a grounded screening layer so that high-frequency emissions can be prevented for example if a high-frequency circuit is implemented with the aid of the printed circuit board.

As already discussed in conjunction with the first additional layer, the second additional layer also features thermal provisions between the inlay and the cooling body so that the heat to be removed passes in a good to very good manner from the inlay through the additional layer to the cooling body. This is the case for example if the inlay does not itself reach to the end of the second additional layer. The heat transfer effected by the thermal provisions is in this case in its turn all the better the thinner the second additional layer is. Advantageously this additional layer is thus likewise a microlayer. If such thermal provisions are present, the cooling body is not pressed onto the inlay, but onto the thermal provision layers. In this case the actual fastening of the cooling body can still be to the inlay.

The thermal provisions in the additional layer can be executed in the manner such as to bring about a filling of the vias in the relevant additional layers with a good to very good heat-conducting material. The vias thus represent something like a solder pot filled with solder tin for example. The advantage is that such fillings can be produced in an automated manner.

In another embodiment the thermal provisions can be implemented in such a way that they provide a largest possible number of vias filled with a good to very good heat-conducting material, where necessary microvias, if the additional layer is a microlayer. These vias can be created with the production of the additional layer in accordance with conventional technical methods for printed circuit boards. With a sufficient large number of such vias the heat transfer practically corresponds to that provided by a massive inlay, without a massive inlay up to the end of an additional layer being needed. The vias can for example be filled with copper, with solder tin, with thermal transfer compound with a high proportion of silver or similar.

The circuit board itself can be a multilayer board which is able to be used for complex circuit implementations. In this case different layers can be implemented with different materials. For example a topmost layer can be implemented with a material for high-frequency circuits, known for example under the designation IS620, and the further layers with a standard circuit board material, known for example under the designation FR5. Furthermore for example the additional can also be implemented between the power components and the inlay with a material suitable for high-frequency technologies and the additional layer between the inlay and the cooling body with a standard printed circuit board material. In this way a very cost-effective hybrid printed circuit board is produced, for example for a high-frequency power and main circuit, for example a high-power output stage consisting of SMD components and an associated high-frequency circuit, which is combined with conventional circuit parts.

The connections between the individual layers, including line connections, can be made with the aid of corresponding through-contacting, if necessary also with microvias and other vias.

BRIEF DESCRIPTION OF THE DRAWINGS

These and other aspects and advantages will become more apparent and more readily appreciated from the following description of the exemplary embodiments, taken in conjunction with the accompanying drawings of which.

The invention will be explained in more detail below with reference to a drawing. The figures show.

DETAILED DESCRIPTION OF THE PREFERRED EMBODIMENT

Figure 1:
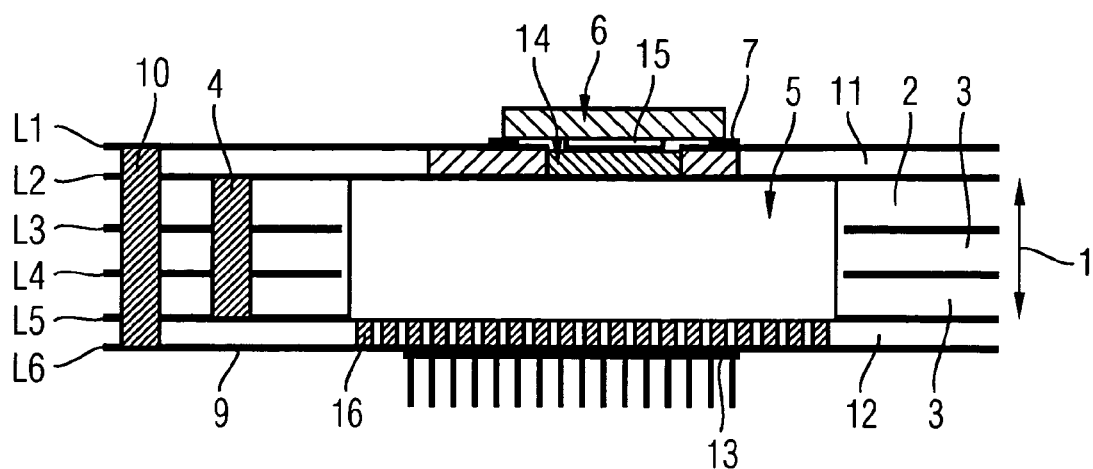
FIG. 1 is a sectional view from the side of an inventive circuit board, shown in a schematic diagram.

Reference will now be made in detail to the preferred embodiments, examples of which are illustrated in the accompanying drawings, wherein like reference numerals refer to like elements throughout.

FIG. 1 shows a multilayer printed circuit board, which has a thickness of 1 mm for example.

The multilayer printed circuit board 1 comprises four layers labeled L2, L3, L4 and L5.

In accordance with the exemplary embodiment the printed circuit board material 2 between the layers L2 and L3 is a printed circuit board material which is known under the designation IS620. The printed circuit board material 3 between the layers L3 and L4 on the one hand and L4 and L5 on the other hand is a printed circuit board material which is known under the designation FR5.

A single through-contacting 4 is shown as an example for the presence of possible through-contacting, which establishes a connection between conductor tracks of the layers L2 and L5 not shown in any greater detail in the drawing.

Furthermore an inlay 5 integrated between the layers L2 to L5 in the plane of the multilayer printed circuit board 1. Since the inlay 5 extends from layer L2 through to layer L5 it has the thickness of the multilayer printed circuit board 1, namely 1 mm. The inlay 5 in the present exemplary embodiment is a massive copper block. This can be pressed into a corresponding cutout in the multilayer printed circuit board 1 during fabrication of the multilayer printed circuit board 1.

After the copper block has been pressed in, the multilayer printed circuit board 1 depicted in FIG. 1 has additionally been provided with two outer layers L1, L6.

The layer L1 is that side of the multilayer printed circuit board 1 which is equipped with the circuit components, represented here in the FIG. 1 by a component 6 embodied, for example, as a high-frequency high-power output stage transistor. The layer L6 is embodied in the present exemplary embodiment as a screening layer 9, which effects a high-frequency screening in an outwards direction of the multilayer printed circuit board 1. To this end this layer L6 is connected to a ground connection not shown in any greater detail in the drawing. It is, however, possible to use this layer as well or solely for line structures.

As also shown in FIG. 1 the layers L1 and L6 can be connected by through-contacting 10 for example within the framework of line connections within an overall circuit.

The printed circuit board material 11 between the layers L1 and L2 in the present exemplary embodiment is the same printed circuit board material which is also used as the printed circuit board material between the layers L2 and L3. The thickness of this printed circuit board material 11 is in the present exemplary embodiment 100 µm.

The printed circuit board material 12 between the layers L5 and L6 is in the present exemplary embodiment the same printed circuit board material, as is used for the printed circuit board material 3 for example between the layers L4 and L5. In this case the printed circuit board material 12 in the present exemplary embodiment has a thickness of 50 to 100 µm.

Through the additional layer labeled L1 the components 6 connected on the additional layer L1 are insulated at least in relation to their connection pins 7 from the layer L2 or respectively inlay 5 arranged below them. It is therefore possible to arrange component 6 with its connecting pins 7 directly above the inlay 5 even if the inlay 5 is significantly greater in its extent in the plane the multilayer printed circuit board 1 than the distance between the connecting pins 7 of a component 6 arranged above it.

The inlay 5 extends in its dimensions far enough beyond the connecting pins 7 of the component 6 arranged above it for mechanical attachment screws 8 (FIG. 2) to still be able to be provided on the inlay 5, for example for the massive mechanical attachment of a cooling body 13.

The cooling body 13 is arranged on the layer L6 below the inlay 5. It outputs the heat of the component 6 arranged above the inlay 5 into the environment to cool it down.

To this end the heat of the component 6 is directed via a solder depot 14 within the layer L1 in the present exemplary embodiment and the printed circuit board material 11 from a heating area 15 of the component 6 between the connecting pins 7 of the component the inlay 5 and a largest possible plurality of vias 16 below the inlay 5 in the printed circuit board material 12 and the layer L6 to the cooling body 13.

The printed circuit board materials 11 and 2 are high-frequency-compatible printed circuit board materials, whereas the printed circuit board materials 3 and 12 are conventional printed circuit board materials.

The component 6, the layers L1 and L2 as well as the printed circuit board materials 11 and 2 in the exemplary embodiment illustrated here represent a high-frequency high-performance circuit which is implemented with the present circuit board. The other layers and printed circuit board materials are representative of a conventional circuit system which is combined with the high-frequency high-performance circuit.

Figure 2:
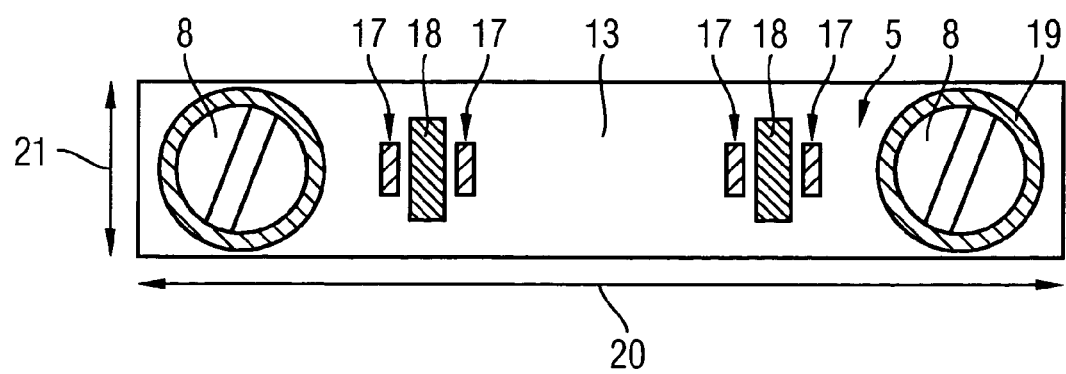
FIG. 2 is a sectional view from above of the circuit board depicted in FIG. 1, likewise in a schematic diagram.

The cooling body 13 is, as already stated, attached by screws 8 to the inlay 5. This is indicated in FIG. 2. Also shown in FIG. 2 are the inlay 5, the relative positions 17 for the connecting pins 7, the relative positions 18 for solder depots 14 and the cooling body 13 in their principle assignments to each other. The screws 8 in this case are provided with washers 19.

The section shown in FIG. 2 naturally has a length 20 of around 35 mm and a width 21 of around 5 mm.

The component 6 addressed in the drawing or the electronic components generally embodied by the component 6 used in conjunction with the present circuit board can be a type of SMD component.

In this case the use of any type of components is also possible.

In the present exemplary embodiment the additional layer L6 is implemented as a microvia layer, so that the vias 16 through to the cooling body 13 are embodied as microvias.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superquide v. DIRECTV*, 358 F3d 870, 69 USPQ2d 1865 (Fed. Cir. 2004).

The invention claimed is:

1. A printed circuit board, comprising:
   a heat-conductive inlay extending within the plane of the printed circuit board with the thickness of the printed circuit board for conducting heat through the printed circuit board;
   at least one single electrical surface-mount device (SMD) component arranged on a side of the printed circuit board above the inlay which heats up during operation, with associated connection pins;
   a heating area arranged between pins;
   a cooling body arranged on an opposite side of the printed circuit board from the at least one SMD component;
   an additional layer arranged above the inlay and simultaneously below the at least one SMD component,
   wherein the extent of the inlay is greater than that of the heating area enclosed by the associated connecting pins of the at least one SMD component arranged above the inlay,
   wherein the additional layer embodied in such a way as to electrically isolate the at least one SMD component arranged on the additional layer above the inlay from the inlay arranged below the least one SMD component and to electrically connect the connection pins, and
   wherein the additional layer further embodied in such a way that, below the heating area of the SMD component arranged above the inlay including where possible the entire heating area of a relevant SMD component, thermal provisions are provided within the additional layer through which the heat is conducted from the heating areas of the SMD component to the inlay.

2. The printed circuit board as claimed in claim 1, wherein the cooling body arranged opposite the SMD component on the opposite of the printed circuit board is pressed onto the inlay with technical means.

3. The printed circuit board as claimed in claim 1, wherein the printed circuit board is provided with a second additional layer between the inlay and the cooling body which is a carrier for at least one single electrical line image and provides thermal provisions between the inlay and the cooling body, onto which the cooling body is pressed with technical means and through which the heat is conducted away from the inlay to the cooling body.

4. The printed circuit board as claimed in claim 1, wherein the printed circuit board is embodied as a multilayer printed circuit board.

5. The printed circuit board as claimed in claim 1, wherein the components are SMD components which as such are part of a high-frequency, high-performance output stage and/or high-frequency circuit.

6. The printed circuit board as claimed in claim 3, wherein the thermal provisions are based on the provision of vias through the additional layers, said vias being filled with a material which has good to very good heat conducting properties.

7. The printed circuit board as claimed in claim 3, wherein at least the additional layer is formed form a material suitable for high-frequency technology.

8. The printed circuit board as claimed in claim 3, wherein at least the second additional layer is embodied with a standard circuit board material.

9. The printed circuit board as claimed in claim 6, wherein the thermal provisions are based on the provision of the largest possible number of vias or microvias filed with material which has good to very good heat conducting properties.

* * * * *